(12) United States Patent
Tsutsumi

(10) Patent No.: US 8,844,883 B2
(45) Date of Patent: Sep. 30, 2014

(54) CABLE HOLDER AND ELECTRONIC SYSTEM

(75) Inventor: Kenji Tsutsumi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 129 days.

(21) Appl. No.: 13/585,104

(22) Filed: Aug. 14, 2012

(65) Prior Publication Data

US 2013/0094164 A1    Apr. 18, 2013

(30) Foreign Application Priority Data

Oct. 14, 2011    (JP) .................... 2011-227312

(51) Int. Cl.
| | | |
|---|---|---|
| *F16L 3/08* | (2006.01) | |
| *H02G 3/32* | (2006.01) | |
| *G02B 6/46* | (2006.01) | |
| *H02G 3/00* | (2006.01) | |
| *H05K 1/14* | (2006.01) | |

(52) U.S. Cl.
CPC .. *H02G 3/32* (2013.01); *G02B 6/46* (2013.01); *H02G 3/26* (2013.01); *H05K 1/148* (2013.01); H05K 2201/10356 (2013.01)
USPC ................ 248/74.2; 248/71; 248/73

(58) Field of Classification Search
CPC ............. F16L 3/04; F16L 3/127; G02B 6/46; H02G 3/26; H02G 3/22; H02G 3/13; H02G 3/233; H02G 3/32; H05K 2201/10356; H05K 1/148

USPC ........ 248/51, 56, 62, 67.5, 67.7, 68.1, 71, 73, 248/74.1; 24/16 PB, 289, 297

See application file for complete search history.

(56) References Cited

U.S. PATENT DOCUMENTS

| | | | | |
|---|---|---|---|---|
| 443,198 | A | * | 12/1890 | Rutzler ........................... 248/55 |
| 2,551,190 | A | * | 5/1951 | Walker ........................ 242/594.5 |
| 3,163,712 | A | * | 12/1964 | Cochran ........................ 174/164 |
| 3,543,353 | A | * | 12/1970 | Meehan ........................ 24/16 PB |
| 3,906,592 | A | * | 9/1975 | Sakasegawa et al. ......... 248/68.1 |
| 4,131,258 | A | * | 12/1978 | Okuda et al. .................... 248/73 |
| 4,484,378 | A | * | 11/1984 | Kimura et al. .............. 24/30.5 S |
| 4,566,660 | A | * | 1/1986 | Anscher et al. .............. 248/74.2 |
| 6,446,916 | B2 | * | 9/2002 | Takeda ......................... 248/74.2 |
| 7,527,226 | B2 | | 5/2009 | Kusuda et al. |
| 8,099,815 | B2 | * | 1/2012 | Kostigian ........................... 15/40 |
| 2007/0221793 | A1 | | 9/2007 | Kusuda et al. |

FOREIGN PATENT DOCUMENTS

JP    2007-259618    10/2007

\* cited by examiner

*Primary Examiner* — Gwendolyn W Baxter
(74) *Attorney, Agent, or Firm* — Staas & Halsey LLP

(57) ABSTRACT

A cable holder includes: a pair of arm portions to form a holding space for holding a cable; and a guide portion, provided at an end portion of each of the pair of guide portions to block the holding space, to guide the cable into the holding space while elastically deforming the pair of arm portions in directions in which the pair of arm portions move away from each other when contacting with the cable.

8 Claims, 19 Drawing Sheets

CABLE HOLDER AND ELECTRONIC SYSTEM

CROSS-REFERENCE TO RELATED APPLICATION(S)

This application is based upon and claims the benefit of priority of the prior Japanese Patent Application No. 2011-227312, filed on Oct. 14, 2011, the entire contents of which are incorporated herein by reference.

FIELD

The embodiments discussed herein are related to a cable holder and an electronic system.

BACKGROUND

In the field of an optical communication, cables including optical fibers are mounted on a substrate together with other electronic components. When cables are mounted on a substrate, extra portions of the cables are fixed onto the substrate using a cable holder.

A related technology is disclosed in Japanese Laid-open Patent Publication No. 2007-259618.

SUMMARY

According to one embodiments of the invention, a cable holder includes: a pair of arm portions to form a holding space for holding a cable; and a guide portion, provided at an end portion of each of the pair of guide portions to block the holding space, to guide the cable into the holding space while elastically deforming the pair of arm portions in directions in which the pair of arm portions move away from each other when contacting with the cable.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Examples of a cable holder include an M-type clamp, an open/close clamp, and a rotary clamp. The M-type clamp may include a pair of arm portions formed in an M shape and an open portion provided between the pair of arm portions. Cables are pushed into the open portion provided between the pair of arm portions so as to be inserted into an internal space and held in the internal space.

The open/close clamp may include an open/close mechanism that can open and close the open portion provided between the pair of arm portions. Cables are inserted into an internal space of the open/close mechanism with the open portion open, and held by the open/close mechanism with the open portion closed.

In the rotary clamp, a cantilever portion that is provided for each of the pair arm and oppose a predetermined open gap, and the pair of arm portions rotate with respect to a substrate. Cables are inserted into an internal space from the gap between the cantilever portions and are held by rotation of the pair of arm portions.

In the M-type clamp, the cables inside may slip out of the open portion between the pair of arm portions.

In the open/close clamp, the cables may be caught on a hook of the open/close mechanism while being fixed.

In the rotary clamp, the cables may be caught on the cantilever portions when the cables are moved along the gap between the cantilever portions. In the rotary clamp, the pair of arm portions are rotated after the cables are inserted into the internal space, which may deteriorate workability.

Figure 1:
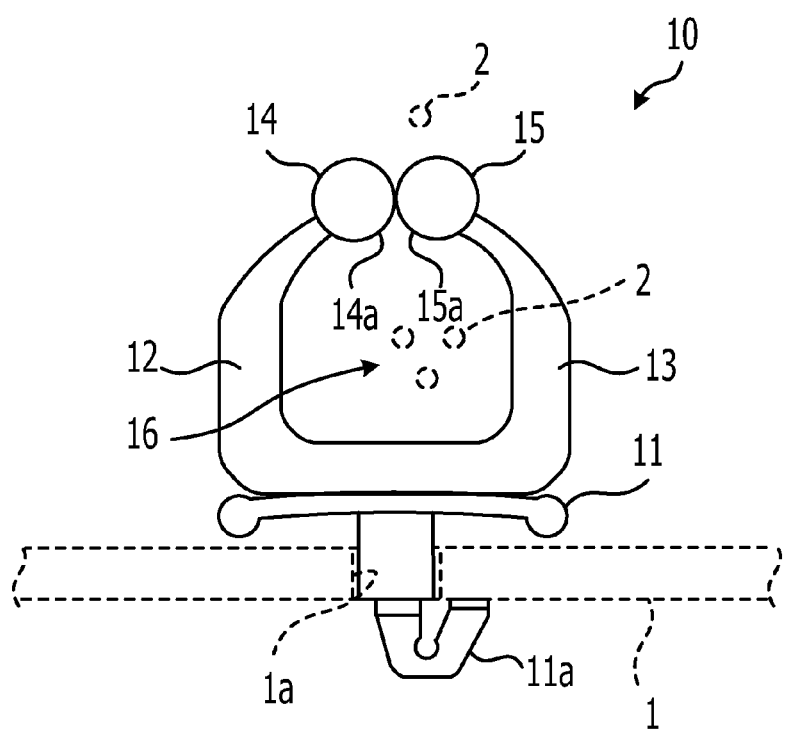
FIG. 1 illustrates an exemplary front view of a cable holder.
Figure 2:
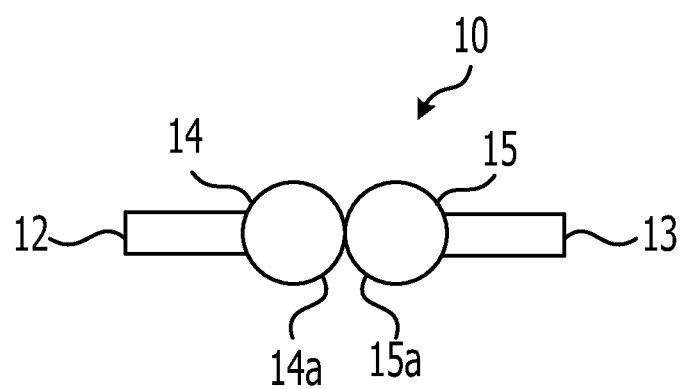
FIG. 2 illustrates an exemplary plan view of the cable holder.

FIG. 1 illustrates an exemplary front view of a cable holder. FIG. 2 illustrates an exemplary plan view of the cable holder. As illustrated in FIGS. 1 and 2, a cable holder 10 includes a pedestal 11, a pair of arm portions 12 and 13 disposed on a surface of the pedestal 11, and cable guide portions 14 and 15 provided at respective distal end portions of the pair of arm portions 12 and 13.

The pedestal 11 fixes the cable holder 10 to a circuit substrate 1. An anchor portion 11a is provided on a surface of the pedestal 11 opposite to the pair of arm portions 12 and 13. The anchor portion 11a is fitted into a through hole is provided in the circuit substrate 1. An open leg portion is formed at the distal end portion of the anchor portion 11a. When the anchor portion 11a is fitted into the through hole 1a, the open leg portion of the anchor portion 11a may be engaged with the back surface of the circuit substrate 1, which may reduce the possibility of the pedestal 11 slipping off the circuit substrate 1.

Respective base end portions of the pair of arm portions 12 and 13 are coupled to each other on the pedestal 11. The pair of arm portions 12 and 13 extend in predetermined directions from their respective base end portions such that a holding space 16 for holding a cable 2 is formed between their respective side surfaces, which oppose each other. A portion of the holding space 16 closer to the respective distal end portions of the pair of arm portions 12 and 13 may be opened for insertion of the cable 2. The pair of arm portions 12 and 13 are formed from an elastic material, and return to their original states even after the pair of arm portions 12 and 13 receive an external force so as to be elastically deformed in directions in which they move away from each other.

The cable guide portions 14 and 15 are provided at the respective distal end portions of the pair of arm portions 12 and 13 to block the open side of the holding space 16. Normally, the cable guide portions 14 and 15 contact each other by utilizing the elasticity of the pair of arm portions 12 and 13 to block the open side of the holding space 16. When contacted by the cable 2 which is inserted into the holding space 16, the cable guide portions 14 and 15 are moved away from each other, and transfer an external force received from the cable 2 to the pair of arm portions 12 and 13. The cable guide portions 14 and 15 guide the cable 2 into the holding space 16 by elastically deforming the pair of arm portions 12 and 13 in the directions in which they move away from each other by transferring the external force received from the cable 2 to the pair of arm portions 12 and 13.

Curved surfaces 14a and 15a may be formed at respective positions of the cable guide portions 14 and 15 contacted by the cable 2. The cable guide portions 14 and 15 may be spherical bodies including the curved surfaces 14a and 15a. The cable guide portions 14 and 15 guide the cable 2 into the holding space 16 along the curved surfaces 14a and 15a. The curved surfaces 14a and 15a may be guide surfaces that allow the cable 2 to smoothly move into the holding space 16.

FIGS. 3A to 3D illustrate an exemplary cable fixing operation. The fixing operation illustrated in FIGS. 3A to 3D may be executed using the cable holder 10 illustrated in FIG. 1.

Figure 3A:
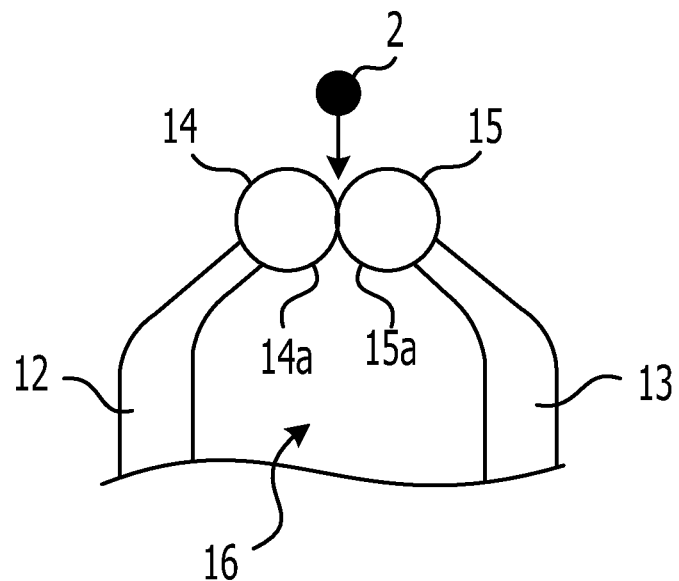
FIGS. 3A to 3D illustrate an exemplary cable fixing operation.

In the initial state of fixing the cable 2 onto the circuit substrate 1, as illustrated in FIG. 3A, the cable 2 is inserted into the holding space 16 from the cable guide portions 14 and 15. At this time, the cable guide portions 14 and 15 contact each other by utilizing the elasticity of the pair of arm portions 12 and 13 to block the open side of the holding space 16.

Figure 3B:
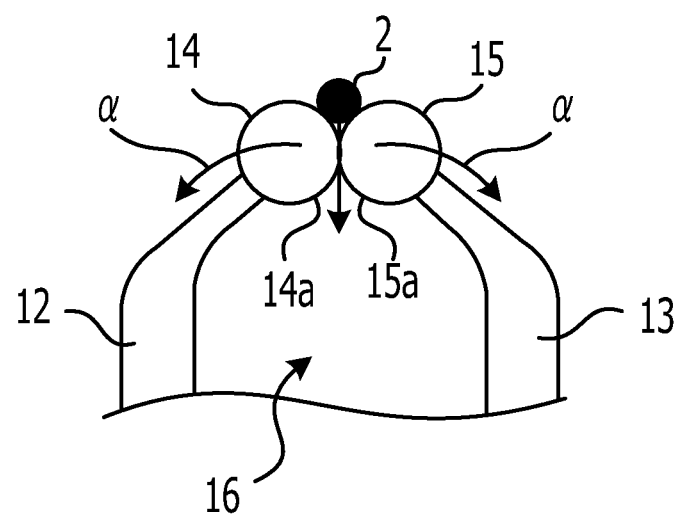
Figure 3C:
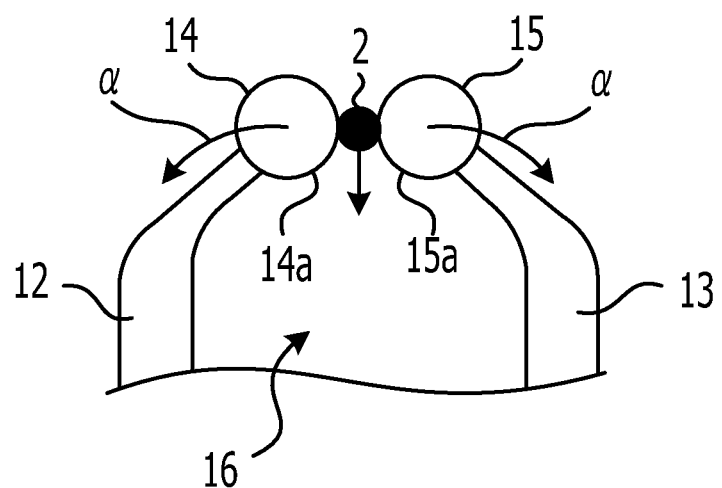

When the cable 2 which is inserted into the holding space 16 contacts the respective curved surfaces 14a and 15a of the cable guide portions 14 and 15 as illustrated in FIG. 3B, the cable guide portions 14 and 15 receive an external force from the cable 2 and are moved away from each other as illustrated in FIG. 3C. The cable guide portions 14 and 15 elastically deform the pair of arm portions 12 and 13 in the directions a in which they move away from each other by transferring the external force received from the cable 2 to the pair of arm portions 12 and 13. At this time, the cable guide portions 14 and 15 guide the cable 2 into the holding space 16 along the curved surfaces 14a and 15a. This allows the cable 2 to be smoothly moved toward the holding space 16, which may reduce damage to the cable 2.

Figure 3D:
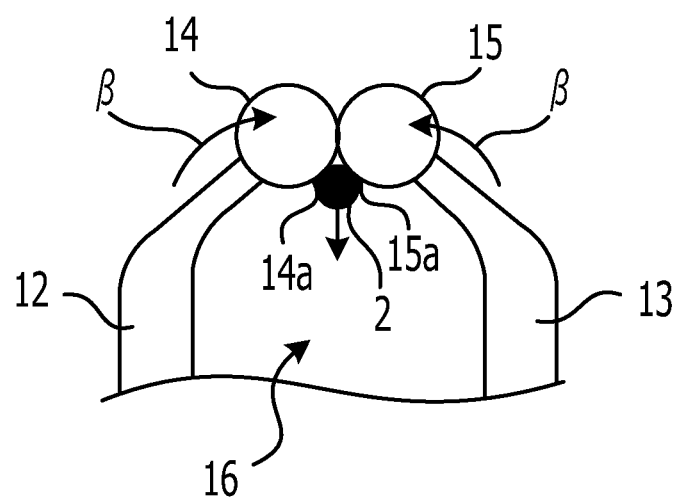

When the cable 2 has been inserted into the holding space 16 as illustrated in FIG. 3D, the respective curved surfaces 14a and 15a of the cable guide portions 14 and 15 do not receive an external force from the cable 2 any more. Therefore, the pair of arm portions 12 and 13 are deformed in the directions 13 in which they move closer to each other by utilizing their own elasticity. Since the pair of arm portions 12 and 13 are thus returned to the state illustrated in FIG. 3A, the cable guide portions 14 and 15 contact each other by utilizing the elasticity of the pair of arm portions 12 and 13 to block the open side of the holding space 16 again. This reduces the possibility of the cable 2 inserted into the holding space 16 slipping out from the open side of the holding space 16, and allows the cable 2 to be stably fixed to the circuit substrate 1.

Figure 4:
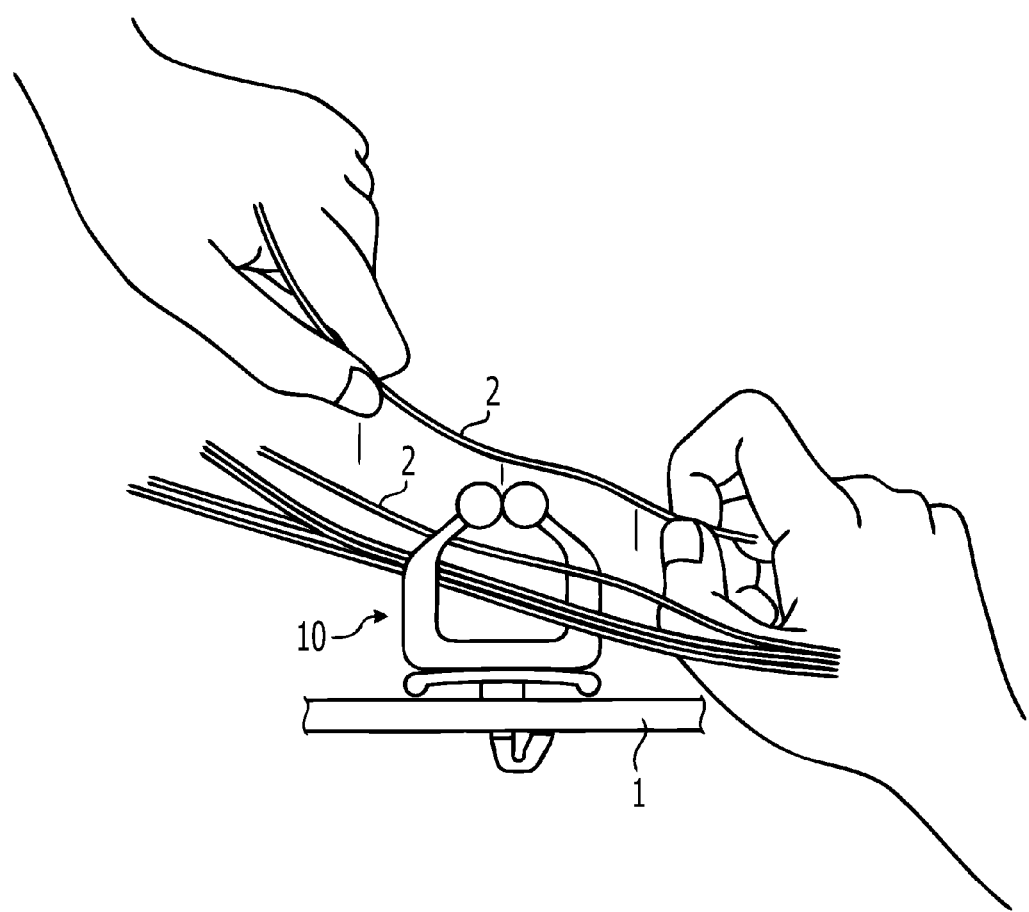
FIG. 4 illustrates an exemplary cable in a fixed state.

FIG. 4 illustrates an exemplary cable in a fixed state. In FIG. 4, cables 2 are fixed to the circuit substrate 1 using the cable holder 10 illustrated in FIG. 1. For example, four cables 2 may be fixed to the circuit substrate 1 via the cable holder 10 by repeating the cable fixing operation illustrated in FIGS. 3A to 3D. The number of the cables 2 may be determined as desired.

In the cable holder 10 illustrated in FIG. 1, the cable guide portions 14 and 15 are provided at the respective distal end portions of the pair of arm portions 12 and 13 to block the holding space 16. When contacted by the cable 2 which is inserted into the holding space 16, the cable guide portions 14 and 15 guide the cable 2 into the holding space 16 by elastically deforming the pair of arm portions 12 and 13 in the directions in which they move away from each other. This allows the cable to be fixed without using an open/close mechanism or cantilever portions. The possibility of the cable being caught on other components may be reduced, and the rotary or locking members may be omitted. Damage to the cable during fixing of the cable may be reduced to improve workability.

In the cable holder 10 illustrated in FIG. 1, the cable guide portions 14 and 15 are spherical bodies. Therefore, the area of contact between the cable guide portions 14 and 15 and the cable 2 is reduced, which reduces damage to the cable 2.

Figure 5:
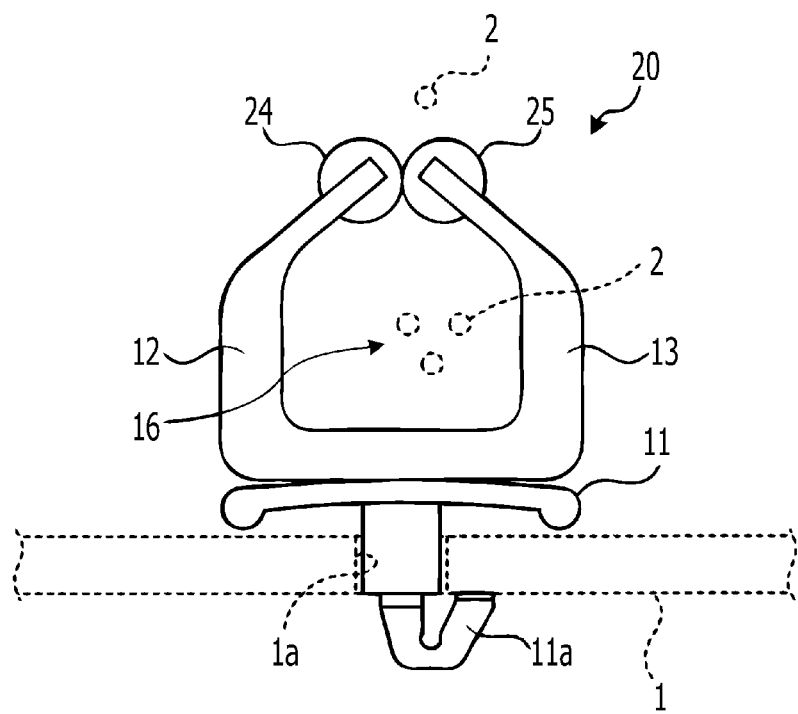
FIG. 5 illustrates an exemplary front view of a cable holder.

FIG. 5 illustrates an exemplary front view of a cable holder. Components in FIG. 5 that are substantially the same as or similar to those illustrated in FIG. 1 may be given the same reference numerals and detailed description thereof will be omitted or reduced.

A cable holder 20 illustrated in FIG. 5 includes cable guide portions 24 and 25 in place of the cable guide portions 14 and 15 illustrated in FIG. 1. Other components may be substantially the same as or similar to the components illustrated in FIG. 1.

The cable guide portions 24 and 25 are rotatably mounted at the respective distal end portions of the pair of arm portions 12 and 13. When contacted by the cable 2 which is inserted into the holding space 16, the cable guide portions 24 and 25 rotate in the direction in which the cable 2 is guided into the holding space 16.

The cable guide portion 25 may be configured to be substantially the same as the cable guide portion 24. The arm portion 13 may be configured to be substantially the same as the arm portion 12.

Figure 6:
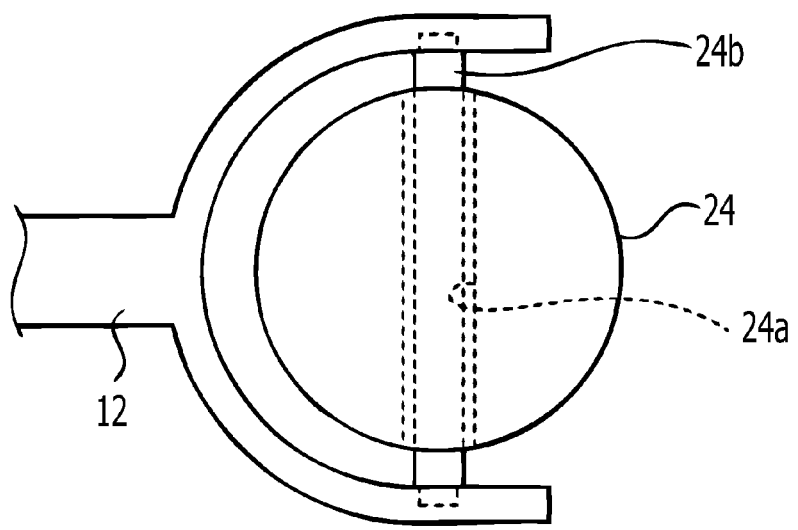
FIG. 6 illustrates an exemplary plan view of a cable guide portion.

FIG. 6 illustrates an exemplary plan view of a cable guide portion. The plan view illustrated in FIG. 6 may be a plan view of the cable guide portion 24 illustrated in FIG. 5. As illustrated in FIG. 6, the cable guide portion 24 which is spherical includes a through hole 24a. The cable guide portion 24 is rotatably mounted at the distal end portion of the arm portion 12 with both ends of a rotary shaft 24b inserted through the through hole 24a fixed to the respective distal end portions of the arm portion 12 formed in a Y shape.

Figure 7:
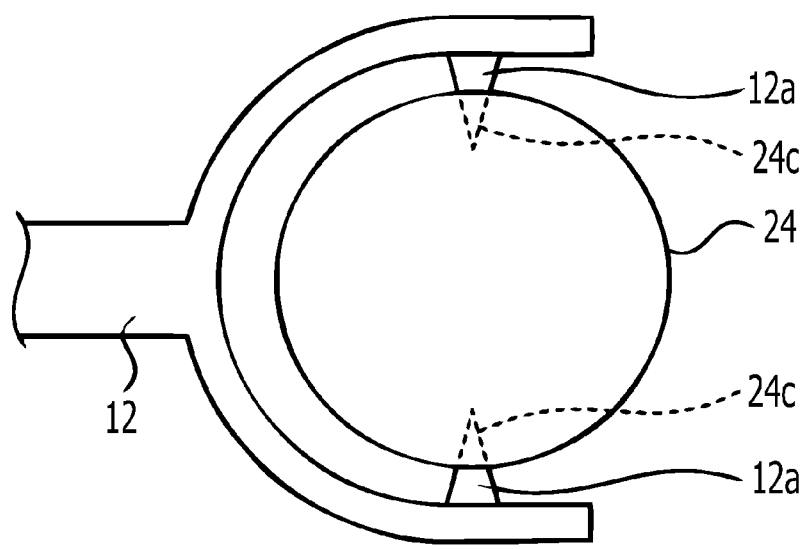
FIG. 7 illustrates an exemplary plan view of a cable guide portion.

FIG. 7 illustrates an exemplary plan view of a cable guide portion. The plan view illustrated in FIG. 7 may be a plan view of the cable guide portion 24 illustrated in FIG. 5. As illustrated in FIG. 7, the cable guide portion 24 which is spherical includes two recessed portions 24c. The cable guide portion 24 is rotatably mounted at the distal end portion of the arm portion 12 with the two recessed portions 24c pivotally mounted on two respective projecting portions 12a provided at the respective distal end portions of the arm portion 12 formed in a Y shape.

Figure 8:
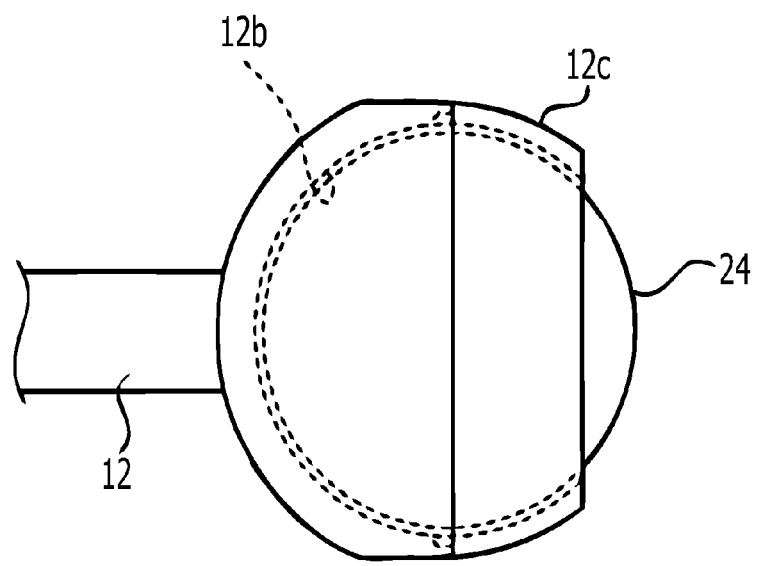
FIG. 8 illustrates an exemplary plan view of a cable guide portion.

FIG. 8 illustrates an exemplary plan view of a cable guide portion. The plan view illustrated in FIG. 8 may be a plan view of the cable guide portion 24 illustrated in FIG. 5. As illustrated in FIG. 8, the cable guide portion 24 which is spherical is rotatably mounted at the distal end portion of the arm portion 12 with the cable guide portion 24 held between a hemispherical recessed portion 12b formed at the distal end portion of the arm portion 12 and a cover 12c having an opening to expose a part of the cable guide portion 24.

FIGS. 9A to 9D illustrate an exemplary cable fixing operation. In FIG. 9, a cable may be fixed using the cable holder 20 illustrated in FIG. 5.

Figure 9A:
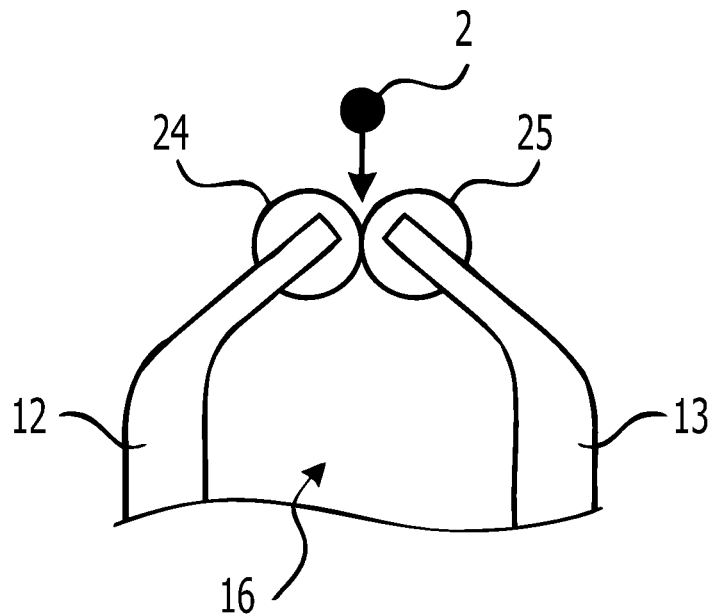
FIGS. 9A to 9D illustrate an exemplary cable fixing operation.

In the initial state of fixing the cable 2 onto the circuit substrate 1, as illustrated in FIG. 9A, the cable 2 is inserted toward the holding space 16 from the cable guide portions 24 and 25. At this time, the cable guide portions 24 and 25 contact each other by utilizing the elasticity of the pair of arm portions 12 and 13 to block the open side of the holding space 16.

Figure 9B:
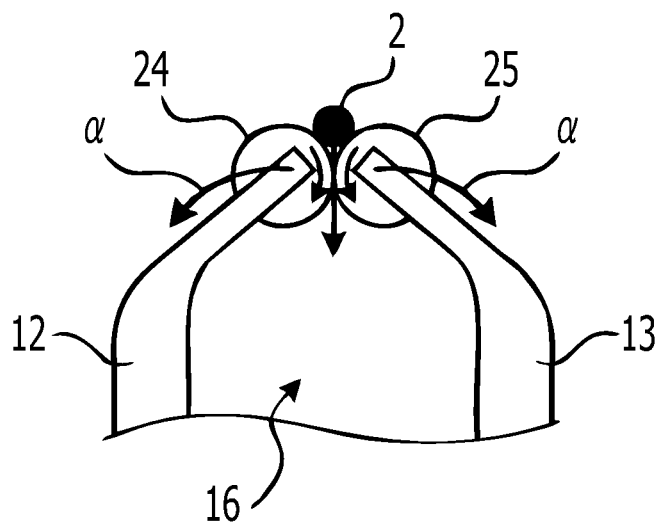
Figure 9C:
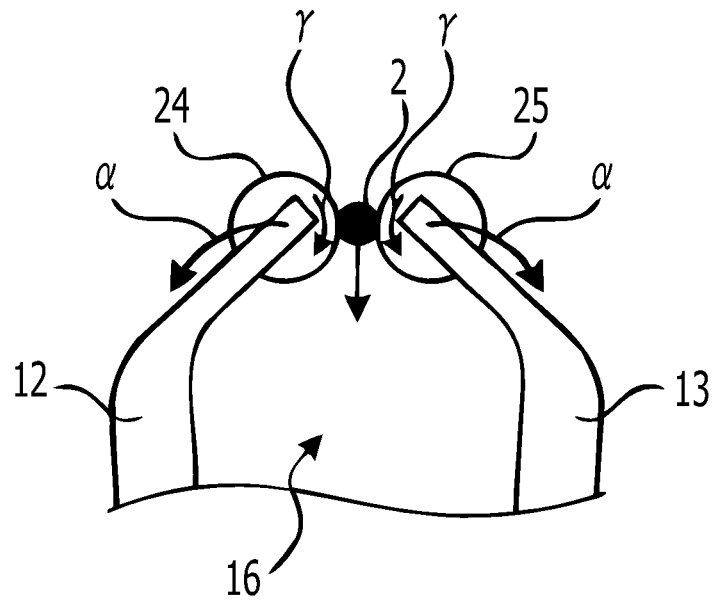

When the cable 2 which is inserted into the holding space 16 contacts the cable guide portions 24 and 25 as illustrated in FIG. 9B, the cable guide portions 24 and 25 receive an external force from the cable 2 and are moved away from each other as illustrated in FIG. 9C. The cable guide portions 24 and 25 elastically deform the pair of arm portions 12 and 13 in the directions a in which they move away from each other by transferring the external force received from the cable 2 to the pair of arm portions 12 and 13. At the same time, the cable guide portions 24 and 25 rotate in the direction γ in which the cable 2 is guided into the holding space 16. This reduces a frictional force applied from the cable guide portions 24 and 25 to the cable 2, which allows the cable 2 to be smoothly moved toward the holding space 16. This may reduce damage to the cable 2.

Figure 9D:
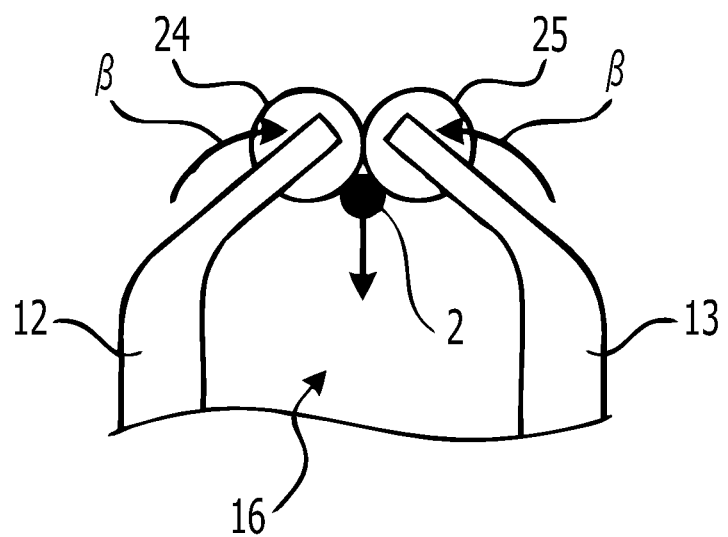

When the cable 2 has been inserted into the holding space as illustrated in FIG. 9D, the cable guide portions 24 and 25 do not receive an external force from the cable 2 any more. Therefore, the pair of arm portions 12 and 13 are deformed in the directions 13 in which they move closer to each other by utilizing their own elasticity. Since the pair of arm portions 12 and 13 return to their original states illustrated in FIG. 9A, the cable guide portions 24 and 25 contact each other by utilizing the elasticity of the pair of arm portions 12 and 13 to block the open side of the holding space 16 again. This may reduce the possibility of the cable 2 inserted into the holding space 16 slipping out from the open side of the holding space 16, and may allow the cable 2 to be stably fixed to the circuit substrate 1.

Figure 10:
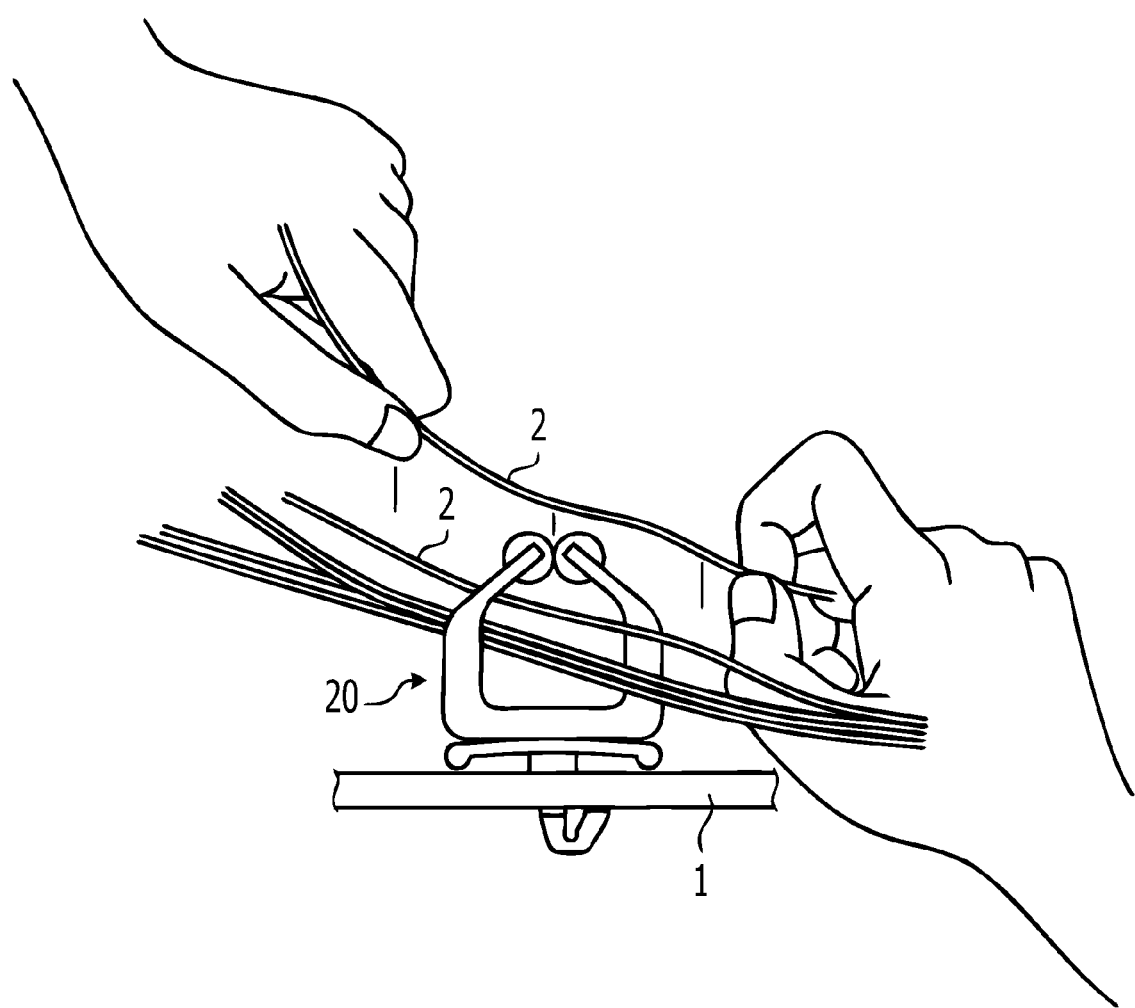
FIG. 10 illustrates an exemplary cable in a fixed state.

FIG. 10 illustrates an exemplary cable in a fixed state. In FIG. 10, cables 2 may be fixed to the circuit substrate 1 using the cable holder 20 illustrated in FIG. 5. For example, four cables 2 may be fixed to the circuit substrate 1 via the cable holder 20 by repeating the cable fixing operation illustrated in FIGS. 9A to 9D. The number of the cables 2 may be determined as desired.

In the cable holder 20 illustrated in FIG. 5, the cable guide portions 24 and 25 are rotatably mounted at the respective distal end portions of the pair of arm portions 12 and 13. When contacted by the cable 2 which is inserted into the holding space 16, the cable guide portions 24 and 25 rotate in the direction in which the cable 2 is guided into the holding space 16. This reduces a frictional force applied from the cable guide portions 24 and 25 to the cable 2, which allows the cable 2 to be smoothly moved toward the holding space 16. Damage to the cable 2 is reduced, which facilitates the operation of installing/uninstalling the cable 2.

Figure 11:
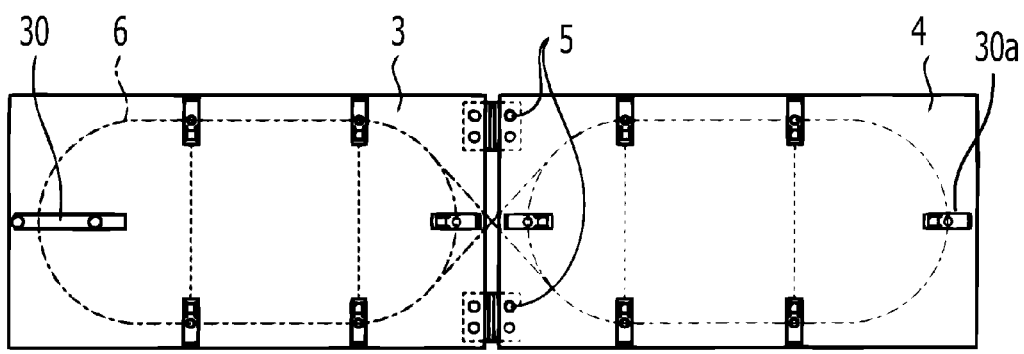
FIG. 11 illustrates an exemplary plan view of a circuit substrate unit.
Figure 12:
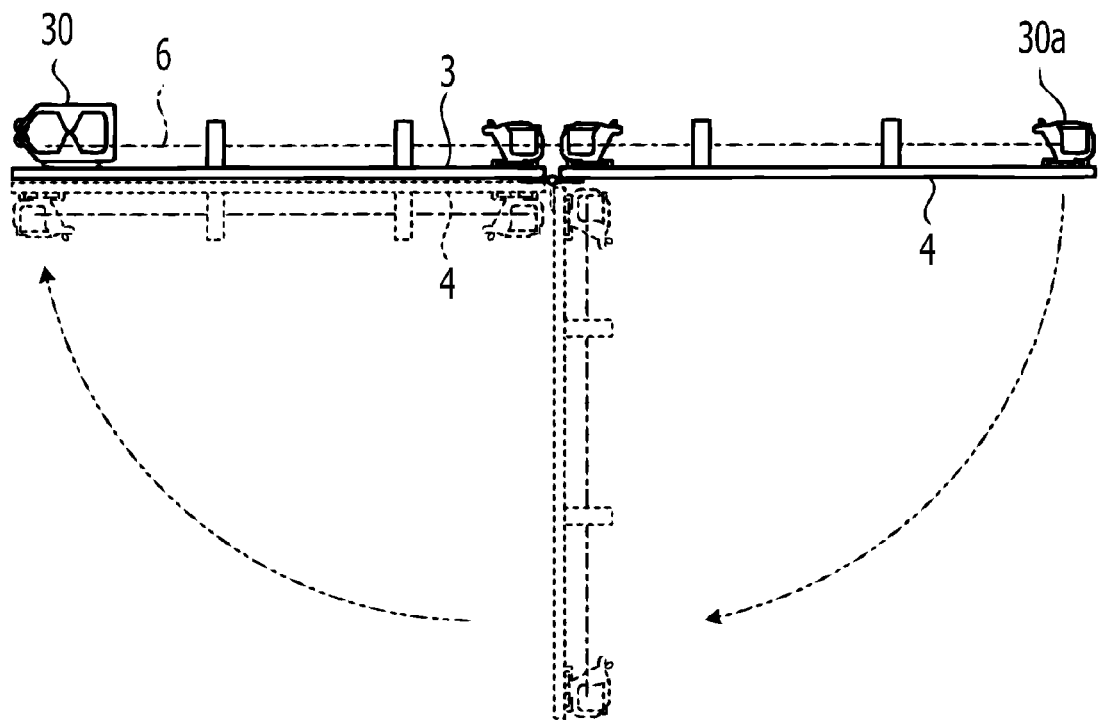
FIG. 12 illustrates an exemplary side view of the circuit substrate unit.

FIG. 11 illustrates an exemplary plan view of a circuit substrate unit. A cable holder 30 is mounted on the circuit substrate unit illustrated in FIG. 11. FIG. 12 illustrates an exemplary side view of the circuit substrate unit. The cable holder 30 is mounted on the circuit substrate unit illustrated in FIG. 12.

In the circuit substrate unit illustrated in FIGS. 11 and 12, a circuit substrate 3 and a circuit substrate 4 are coupled to each other so as to be foldable via hinges 5. A cable 6 is fixed to the circuit substrate 3 and the circuit substrate 4 using the cable holder 30 and an open/close clamp 30a. When the operation of fixing the cable 6 using the cable holder 30 and the open/close clamp 30a is performed, the circuit substrate 3 and the circuit substrate 4 may be maintained in a flat state as illustrated in FIG. 11.

In the case where the circuit substrate unit is housed in a device housing or the like, the circuit substrate unit may be brought into a folded state with the circuit substrate 3 and the circuit substrate 4 rotated via the hinges 5 as indicated by the broken lines in FIG. 12. In the folded state, an unintentional tensional force may act on the cable 6 and move the cable 6.

The open/close clamp 30a has one space for holding the cable 6. This may allow the circuit substrate unit to be brought into the folded state. Therefore, when the cable 6 is moved out of the range of the space for holding the cable 6, an extra tensional force may act on the cable 6 and damage the cable 6.

Figure 13:
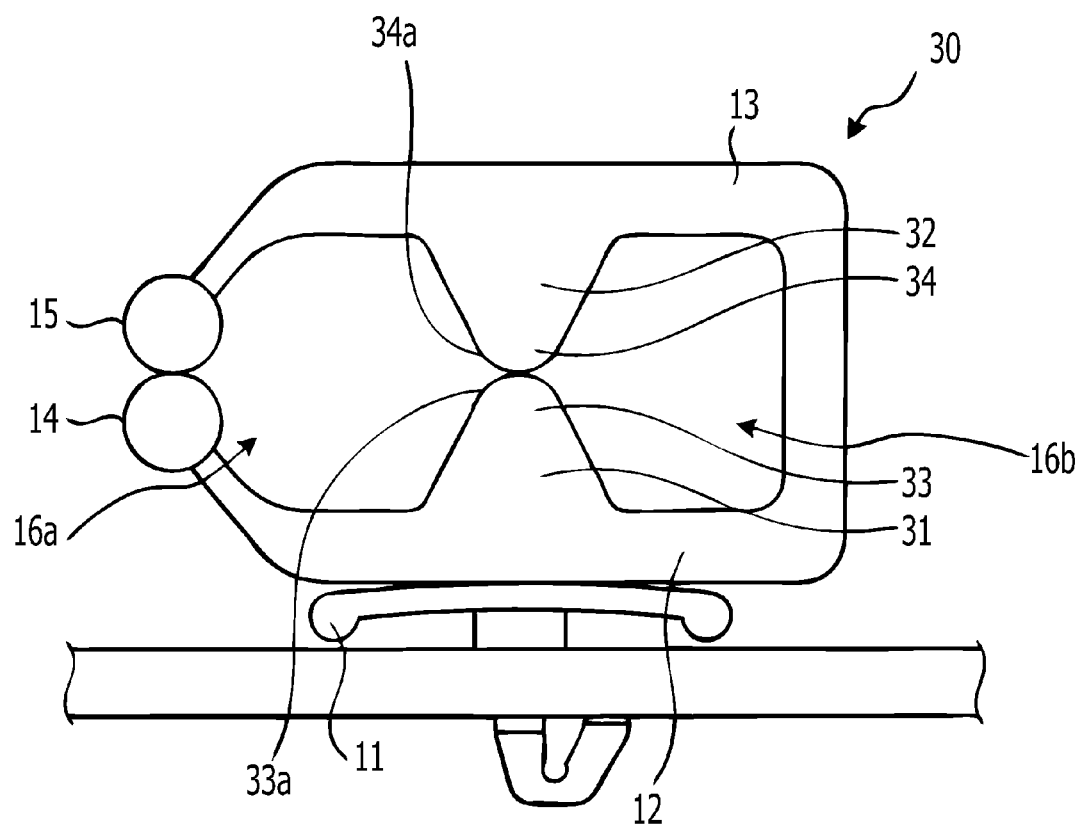
FIG. 13 illustrates an exemplary front view of a cable holder.

FIG. 13 illustrates an exemplary front view of a cable holder. The front view illustrated in FIG. 13 may be a front view of the cable holder 10 illustrated in FIG. 1. Elements in FIG. 13 that are substantially the same as or similar to those illustrated in FIG. 1 may be given the same reference numerals and description thereof will be omitted or reduced.

The cable holder 30 illustrated in FIG. 13 may include the elements of the cable holder 10 illustrated in FIG. 1, intermediate projecting portions 31 and 32, and moved cable guide portions 33 and 34.

The intermediate projecting portions 31 and 32 are provided to project from respective middle portions of the pair of arm portions 12 and 13 to partition the holding space 16 into a first space 16a and a second space 16b. The first space 16a may be a space for holding cables when the circuit substrate 3 and the circuit substrate 4 are in the flat state. The second space 16b may be a space for holding cables that move out of the range of the first space 16a when the circuit substrate 3 and the circuit substrate 4 are brought into the folded state.

The moved cable guide portions 33 and 34 are provided at the respective distal end portions of the intermediate projecting portions 31 and 32. Normally, the moved cable guide portions 33 and 34 contact each other by utilizing the elasticity of the pair of arm portions 12 and 13 to block the boundary between the first space 16a and the second space 16b. When contacted by the cable 6 which is moved from the first space 16a into the second space 16b with the circuit substrate 3 and the circuit substrate 4 in the folded state, the moved cable guide portions 33 and 34 transfer an external force received from the cable 6 to the pair of arm portions 12 and 13. For example, the moved cable guide portions 33 and 34 guide the cable 2 into the second space 16b while elastically deforming the pair of arm portions 12 and 13 in the directions in which they move away from each other by transferring the external force received from the cable 6 to the pair of arm portions 12 and 13.

Curved surfaces 33a and 34a are formed at respective positions of the moved cable guide portions 33 and 34 contacted by the cable 6. The moved cable guide portions 33 and 34 may be formed as spherical bodies including the curved surfaces 33a and 34a. The moved cable guide portions 33 and 34 guide the cable 6 from the first space 16a into the second space 16b along the curved surfaces 33a and 34a. The curved surfaces 33a and 34a may be guide surfaces that allow the cable 6 to smoothly move into the second space 16b.

Figure 14:
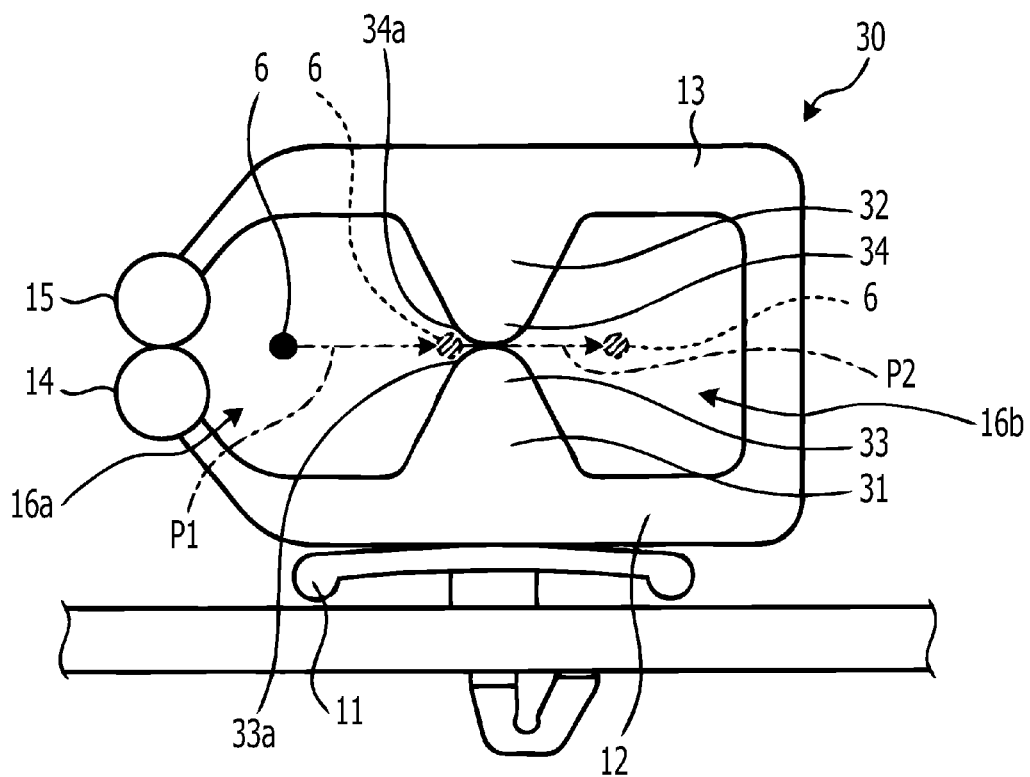
FIG. 14 illustrates an exemplary front view of the cable holder.

FIG. 14 illustrates an exemplary front view of a cable holder. In FIG. 14, the cable holder 30 during a transition of the circuit substrate unit from the flat state to the folded state is illustrated.

When the circuit substrate unit is in the flat state, the cable 6 is held in the first space 16a. Normally, the moved cable guide portions 33 and 34 contact each other by utilizing the elasticity of the pair of arm portions 12 and 13 to block the boundary between the first space 16a and the second space 16b.

When the circuit substrate 3 and the circuit substrate 4 start rotating via the hinges 5, a predetermined tensional force acts on the cable 6. This causes the cable 6 to start moving from the first space 16a toward the second space 16b as indicated by the arrow P1 of FIG. 14.

When the cable 6 moving into the second space 16b contacts the respective curved surfaces 33a and 34a of the moved cable guide portions 33 and 34, the moved cable guide portions 33 and 34 receive an external force from the cable 6 and are moved away from each other. The moved cable guide portions 33 and 34 elastically deform the pair of arm portions 12 and 13 in the directions in which they move away from each other by transferring the external force received from the cable 6 to the pair of arm portions 12 and 13. The moved cable guide portions 33 and 34 guide the cable 6 from the first space 16a into the second space 16b along the curved surfaces 33a and 34a as indicated by the arrow P2 of FIG. 14. This allows the cable 6 to be smoothly moved toward the second space 16b, which reduces damage to the cable 6.

When the circuit substrate 3 and the circuit substrate 4 are in the folded state, the cable 6 is held in the second space 16b. When the cable 6 is moved out of the range of the first space 16a with the circuit substrate unit brought into the folded state, for example, the amount of movement of the cable 6 may be absorbed by the second space 16b.

In the cable holder 30, the moved cable guide portions 33 and 34 are provided at the respective distal end portions of the intermediate projecting portions 31 and 32 which partition the holding space 16 into the first space 16a and the second space 16b. When contacted by the cable 6 which is moved from the first space 16a into the second space 16b, the moved cable guide portions 33 and 34 guide the cable 6 into the second space 16b while elastically deforming the pair of arm portions 12 and 13 in the directions in which they move away from each other. Even when the cable 6 is moved out of the range of the first space 16a with the circuit substrate unit brought into the folded state, the amount of movement of the cable 6 may be absorbed by the second space 16b. A tensional force acting on the cable 6 may be reduced, which may reduce damage to the cable 6.

Figure 15:
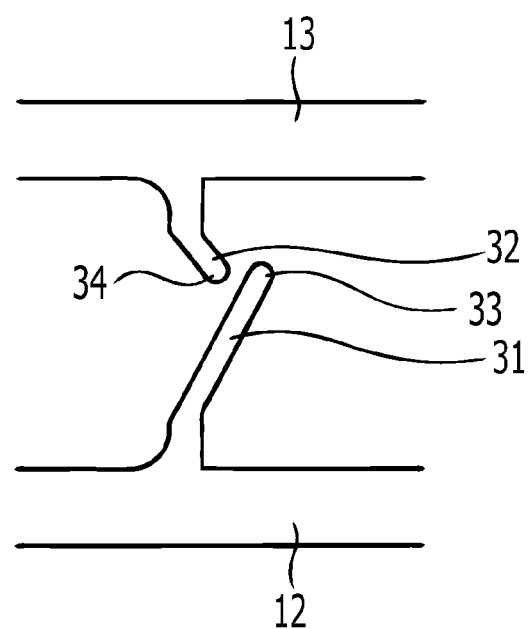
FIG. 15 illustrates an exemplary moved cable guide portions.

Normally, the moved cable guide portions 33 and 34 may contact each other. FIG. 15 illustrates an exemplary moved cable guide portion. A predetermined gap may be provided between the moved cable guide portions 33 and 34 as illustrated in FIG. 15. The cable guide portions illustrated in FIG. 15 may be substantially the same as or similar to the moved cable guide portions 33 and 34 illustrated in FIG. 11.

Figure 16:
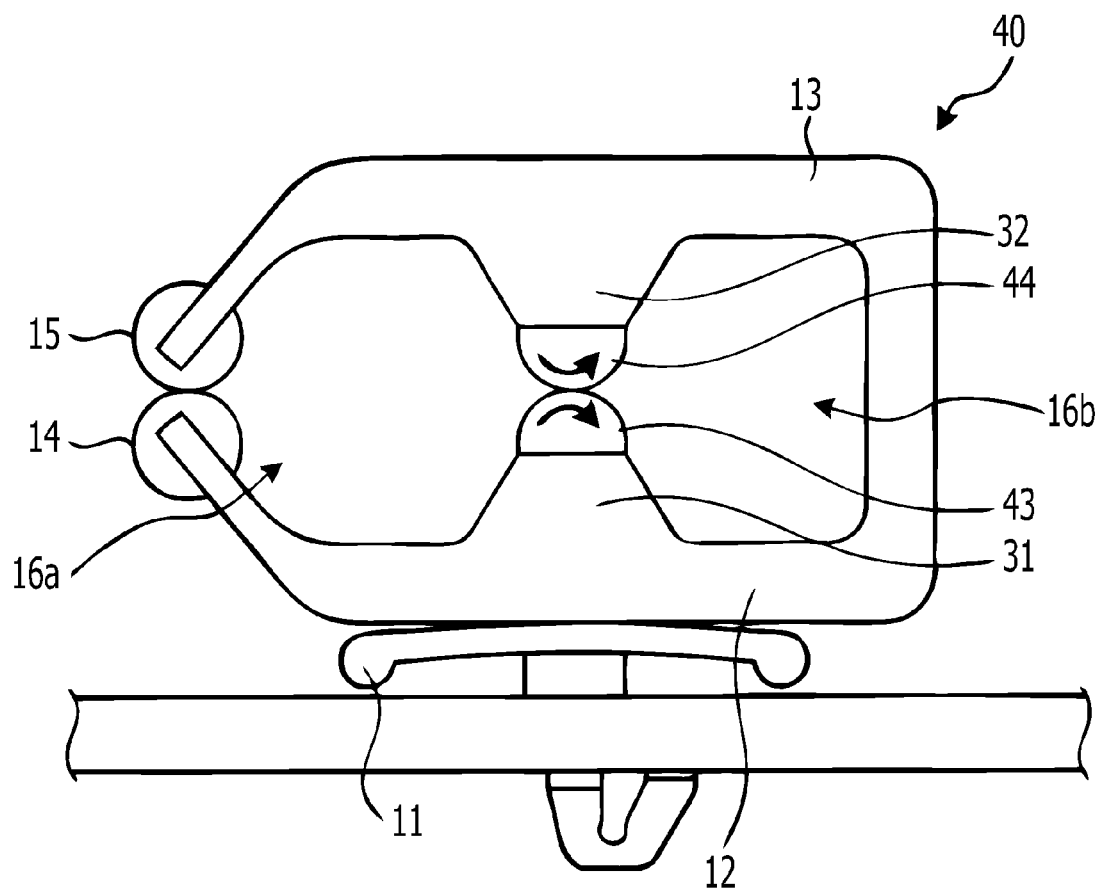
FIG. 16 illustrates an exemplary front view of a cable holder.

FIG. 16 illustrates an exemplary front view of a cable holder. Elements in FIG. 16 that are substantially the same as or similar to those illustrated in FIG. 13 may be given the same reference numerals and description thereof may be omitted or reduced.

As illustrated in FIG. 16, a cable holder 40 may include moved cable guide portions 43 and 44 in place of the moved cable guide portions 33 and 34 illustrated in FIG. 13. Except for the moved cable guide portions 43 and 44, the cable holder 40 may be configured to be substantially the same as or similar to the cable holder 30 illustrated in FIG. 13.

The moved cable guide portions 43 and 44 are rotatably mounted at the respective distal end portions of the intermediate projecting portions 31 and 32. When contacted by the cable 6 which is moved into the second space 16b, the moved cable guide portions 43 and 44 rotate in the direction in which the cable 6 is guided into the second space 16b.

In the cable holder 40 illustrated in FIG. 16, when the moved cable guide portions 43 and 44 are contacted by the cable 6 which is moved into the second space 16b, the moved cable guide portions 43 and 44 rotate in the direction in which the cable 6 is guided into the second space 16b. This may reduce a frictional force applied from the moved cable guide portions 43 and 44 to the cable 6, which may allow the cable 6 to be smoothly moved toward the second space 16b. Damage to the cable 6 is reduced, which reduces damage to the cable 6.

Figure 17:
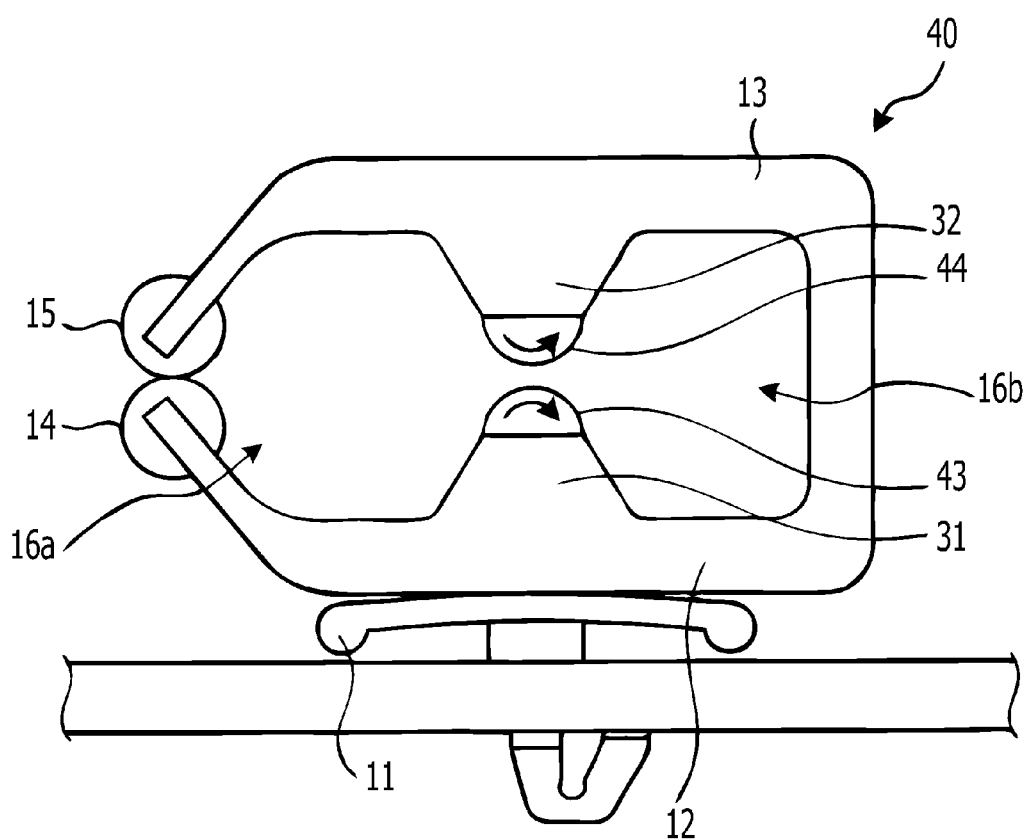
FIG. 17 illustrates an exemplary moved cable guide portions.

Normally, the moved cable guide portions 43 and 44 illustrated in FIG. 16 may contact each other. FIG. 17 illustrates an exemplary moved cable guide portion. A predetermined gap may be provided between the moved cable guide portions 43 and 44 as illustrated in FIG. 17. Except for the moved cable guide portions 43 and 44, the cable holder 40 may be configured to be substantially the same as or similar to the cable holder 40 illustrated in FIG. 16.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A cable holder comprising:
    a pair of arm portions to form a holding space to hold a cable; and
    a guide portion, provided at an end portion of each of the pair of arm portions to block the holding space, to guide the cable into the holding space while elastically deforming the pair of arm portions in directions in which the pair of arm portions move away from each other when contacting the cable,
    wherein each of the pair of arm portions includes a recessed portion at the end portion, and the guide portion, has a first spherical body and is provided in the recessed portion so that a portion of the first spherical body projects from the recessed portion.

2. The cable holder according to claim 1,
    wherein a curved surface of a portion of the first spherical body is formed at a position contacted by the cable and guides the cable into the holding space along the curved surface.

3. The cable holder according to claim 1,
    wherein the guide portion is rotatably mounted at the end portion of each of the pair of guide portions, and
    the guide portion rotates in a direction in which the cable is guided into the holding space.

4. The cable holder according to claim 1, further comprising:

an intermediate projecting portion provided at a middle portion of each guide portion so as to project from the middle portion and partition the holding space into a first space and a second space.

5. The cable holder according to claim 4, further comprising:
a moved cable guide portion, provided at an end portion of the intermediate projecting portion, to guide the cable into the second space while elastically deforming the pair of arm portions in directions in which the pair of arm portions move away from each other when contacting with the cable which moves from the first space into the second space.

6. The cable holder according to claim 5,
wherein the moved cable guide portion including a curved surface formed at a position contacted by the cable which is moved into the second space and guides the cable into the second space along the curved surface.

7. The cable holder according to claim 5,
wherein the moved cable guide portion is rotatably mounted at the intermediate projecting portion, and rotates in a direction in which the cable is guided into the second space when contacting with the cable which moves into the second space.

8. The cable holder according to claim 7,
wherein the moved cable guide portion includes a second spherical body.

* * * * *